United States Patent [19]
Khashayar

[11] Patent Number: 5,367,472
[45] Date of Patent: Nov. 22, 1994

[54] KEYBOARD TESTING METHODS AND APPARATUS

[75] Inventor: Abbas Khashayar, Anaheim, Calif.

[73] Assignee: Alps Electric Co., Ltd., Tokyo, Japan

[21] Appl. No.: 778,435

[22] Filed: Oct. 16, 1991

[51] Int. Cl.$^5$ .................. G06F 11/22; G06F 15/20
[52] U.S. Cl. ................... 364/550; 364/481; 371/15.1; 395/275
[58] Field of Search ............ 364/550, 514, 551.01, 364/480, 481, 189; 395/325, 161, 275; 371/15.1, 16.1

[56] References Cited

U.S. PATENT DOCUMENTS

| | | | |
|---|---|---|---|
| Re. 31,865 | 4/1985 | Van Bavel et al. | |
| 3,602,897 | 8/1971 | Igel | 364/900 |
| 4,175,284 | 11/1979 | Shuraym | |
| 4,187,540 | 1/1978 | Davis et al. | 371/15.1 X |
| 4,393,498 | 7/1983 | Jackson et al. | 371/29.1 |
| 4,403,302 | 9/1983 | Young et al. | 364/900 |
| 4,408,299 | 10/1983 | Young | 364/900 |
| 4,573,152 | 2/1986 | Greene et al. | 371/15.1 |
| 5,119,489 | 6/1992 | Bond et al. | 371/29.1 X |
| 5,222,228 | 6/1993 | Asprey | 364/189 X |

OTHER PUBLICATIONS

*COP680C/COP681C/COP880C/COP881C/COP980C/COP981C Microcontrollers*, (National Semiconductor Corporation, Jun. 1991), pp. 1-24.

*MF2 Compatible Keyboard with COP8 Microcontrollers*, (National Semiconductor Corporation, Feb. 1991), pp. 1-20.

*IBM Personal System/2 ® Hardware Interface Technical Reference* (First Edition, May 1988), chapter "Keyboards (101- and 102-Key)," pp. 19-22.

*COP8 Microcontroller Development Support. Duplicator Board Instruction Manual* (National Semiconductor Corporation, Mar. 1991, NCS Publication Number 420421256-001).

*Primary Examiner*—Kevin J. Teska
*Attorney, Agent, or Firm*—Guy W. Shoup; Brian D. Ogonowsky; Patrick T. Bever

[57] ABSTRACT

An IBM PC compatible keyboard is provided which, on power-up, does not access the keyboard LEDs until receiving a command from the host computer. When the keyboard controller performs a Basic Assurance Test (BAT) on power-up before receiving a host command, the controller does not turn on the LEDs. Upon receiving a Reset command from the host, the controller: (1) turns on the LEDs and performs a BAT with LEDs on; and (2) flashes the LEDs a second time to be compatible with the IBM PCs. Another feature of the invention is a non-destructive test of the controller RAM during BATs. The RAM is tested non-destructively both for the "stuck-at-1" and the "stuck-at-0" conditions. Still another feature is that the controller determines the state of the keyboard LEDs without reading a hardware port. The controller keeps track of the LED state by flags in the controller memory, and the controller determines the LED state by reading the flags.

10 Claims, 6 Drawing Sheets

KEYBOARD TESTING METHODS AND APPARATUS

A portion of the disclosure of this patent document contains material which is subject to copyright protection. The copyright owner has no objection to the facsimile reproduction by anyone of the patent document or the patent disclosure, as it appears in the Patent and Trademark patent file or records, but otherwise reserves all copyright rights whatsoever.

This patent document contains a microfiche appendix. The total number of microfiche in the appendix is 1. The total number of frames in the appendix is 76.

BACKGROUND OF THE INVENTION

This invention relates to computers, and more particularly to testing of computer input devices such as keyboards.

Figure 1:
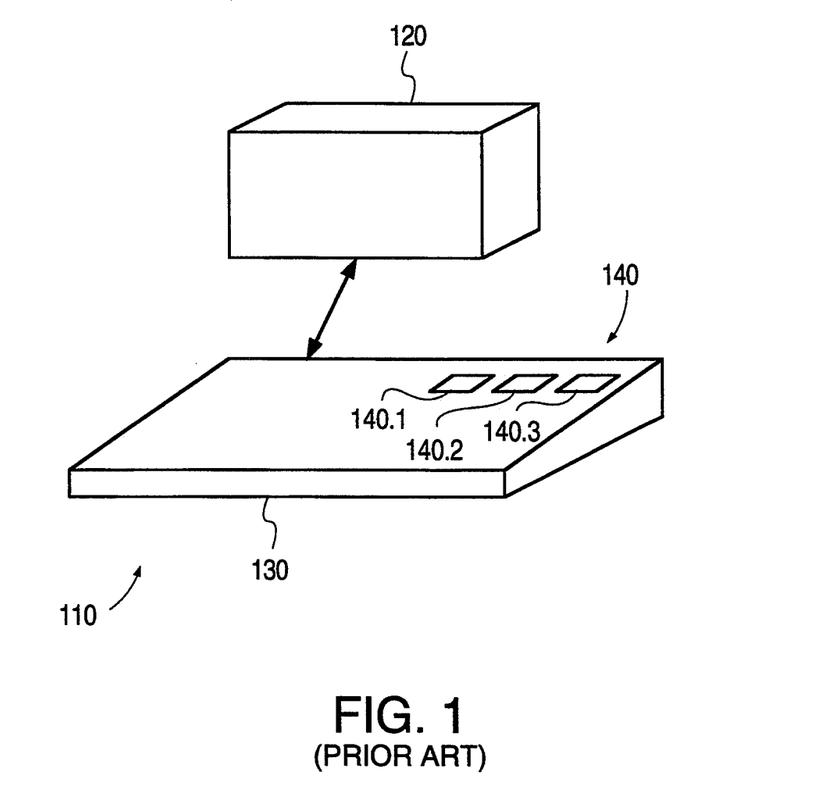
FIG. 1 is a block diagram of a prior art computer system.

FIG. 1 shows a computer system 110 such as an IBM® Personal Computer (IBM PC) available from the IBM Corporation of San Jose, Calif. System 110 includes host computer 120 and keyboard 130 which has keys (not shown) and lights 140. Lights 140 are typically LEDs (light emitting diodes). Light 140.1 is called NumLock LED. Light 140.2 is CapsLock LED. Light 140.3 is ScrollLock LED. The CapsLock LED 140.2 is turned on when the user depresses the CapsLock key (not shown) so as to input capital letters. LEDs 140.1 and 140.3 likewise are turned on when certain keys are depressed.

Keyboard 130 is typically controlled by a keyboard controller (not shown) which sends the information about the keys to host computer 120 and which controls LEDs 140 in response to commands from host computer 120.

On power-up (when power is first applied to the system), the keyboard controller tests the keyboard. During testing, the controller turns on LEDs 140 to visually test the LEDs.

On power-up, the IBM PCs perform the following procedure.

A. Within predetermined time limits after the power-up, the controller performs a Basic Assurance Test (BAT) in which the controller tests the keyboard. The controller turns on LEDs 140 at the beginning of the BAT and turns them off at the end of the BAT.

B. Then host 120 sends a Reset command to keyboard 130. In response, the controller repeats the BAT. LEDs 140 are turned on at the start of this BAT and turned off at the end of this BAT. In short, in the IBM PCs, the controller performs two BATs on power-up, and the LEDs flash twice-once on each BAT.

IBM-PC-compatible systems ("IBM-compatibles") generally follow the same procedure.

In some situations it is desirable to provide an IBM-compatible keyboard which satisfies different requirements from the IBM PC keyboard but which still is closely compatible with the IBM PC keyboard both on power-up and during normal operation. One such situation was discovered by the inventor and is described below.

SUMMARY OF THE INVENTION

The inventor has discovered that it is desirable to provide a keyboard in which the controller on power-up does not turn on LEDs until it receives a command from the host computer. Note that in the prior-art IBM procedure above, the controller turns on LEDs during the first BAT (at step A) before the controller receives any command from host 120. By contrast, some embodiments of the keyboard of the invention turn on LEDs only after receiving a command from the host.

At the same time, in some embodiments, the keyboard of the invention is closely compatible with the IBM PCs even on power-up. Namely, (a) the keyboard performs at least two BATs on power-up; the first BAT is performed within the same time limits as the first BAT in the IBM PCs;

(b) during at least one BAT, the LEDs are turned on at the beginning of the BAT and turned off at the end;

(c) the LEDs flash twice.

In some embodiments this capability is achieved as follows. On power-up, the first BAT is performed without turning LEDs on. When the host computer issues a Reset to the keyboard, another BAT (at step (b)) is performed with LEDs turned on and then off. Then the keyboard controller flashes the LEDs a second time.

In some embodiments, if the host, before issuing a Reset, issues a command to turn on a particular LED, the state of that LED is preserved after a Reset. Namely, on Reset, the controller flashes the LEDs twice as described above, and then turns that particular LED on.

The invention also provides non-destructive RAM tests in BATs. Namely, the keyboard controller typically includes a RAM (random access memory) which is tested during each BAT. To test the RAM, the controller writes data to the RAM, reads the data back and checks the read data. Such a test typically destroys the original data in the RAM. It is sometimes desirable, however, not to destroy the original data. According to the invention, RAM tests are provided which do not destroy the original data, and which still test every bit of the RAM for either the "stuck-at-1" or the "stuck-at-0" condition or both.

Further, the invention allows the controller to determine the state of the LEDs without reading the hardware ports through which the controller controls the LEDs. Hardware ports sometimes cannot be read reliably. Hence the controller of the invention keeps a software flag for each LED whose state the controller may need to determine. When the controller turns on the LED in response to the host command, the controller sets the respective flag. When the controller turns off the LED, the controller resets the flag. To determine whether the LED is on, the controller reads the flag rather than the hardware port.

This summary does not describe all the features of the invention. The invention therefore is defined by the appended claims.

DESCRIPTION OF THE PREFERRED EMBODIMENTS

Figure 2:
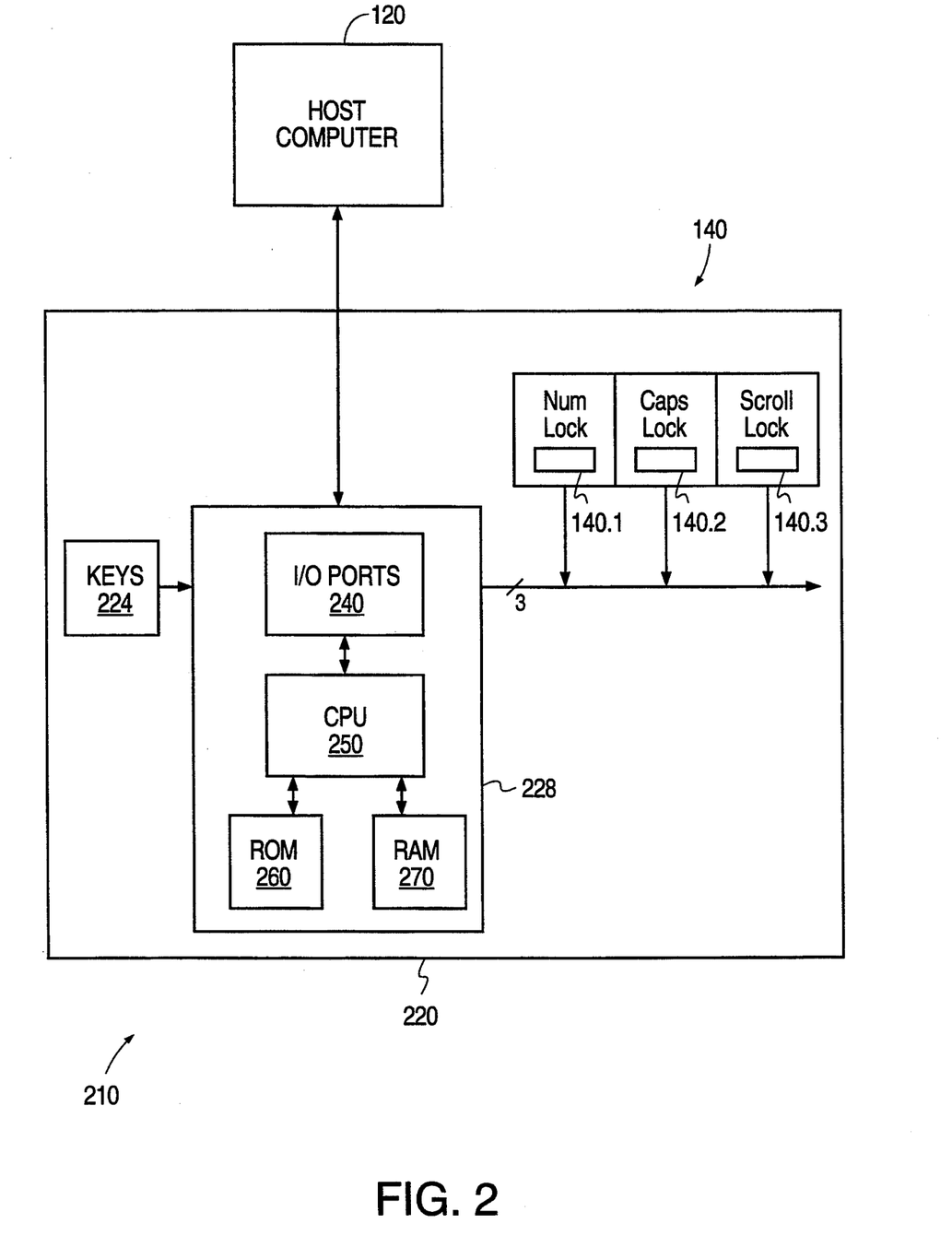
FIG. 2 is a block diagram of a computer system according to this invention.

FIG. 2 shows a block diagram of an IBM PC compatible computer system 210 operating according to this invention. Host computer 120 is an IBM PC host or an IBM compatible host. Keyboard 220 contains keys shown schematically at 224, and LEDs 140. Keyboard 220 has also keyboard controller 228 such as, for examples, a microcontroller COP880C available from the National Semiconductor Corporation of Santa Clara, Calif. and described in *COP680C/ COP681C-/COP880C/COP881C/COP980C/COP981C Microcontrollers* (*National Semiconductor Corporation*, June 1991) which publication is incorporated by reference herein. Controller 228 accesses LEDs 140 through its ports 240.

In controller 228, CPU (central processing unit) 250 executes a program in read-only memory (ROM) 260. CPU 250 uses random access memory (RAM) 270 for data storage as needed.

The program in ROM 260 controls CPU 250 so as: (1) to provide a high degree of compatibility between keyboard 220 and an IBM PC keyboard, and, at the same time, (2) not to turn on LEDs 140 until receiving a command from host 120.

Figure 3A:
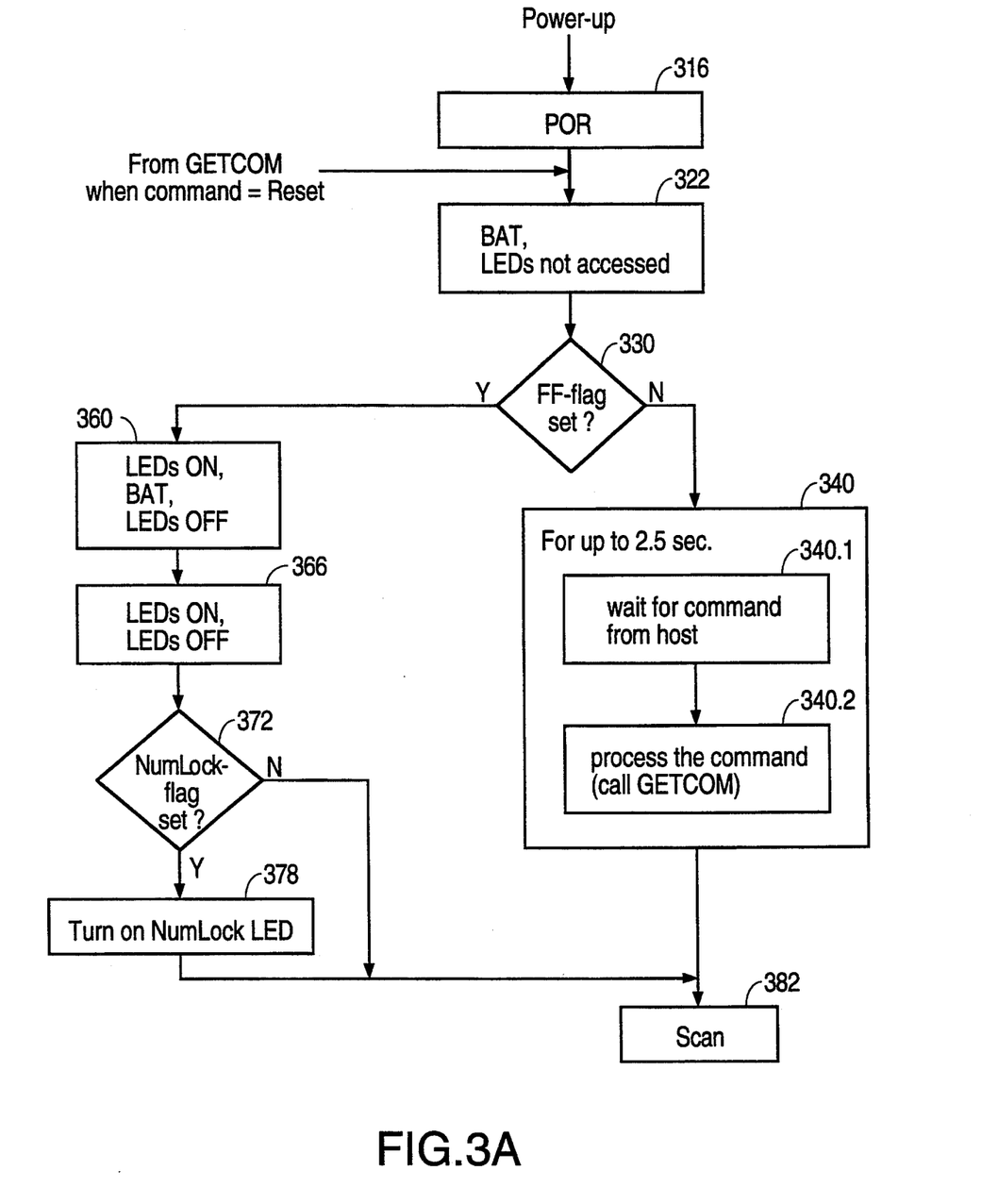
FIGS. 3A and 3B present a flow chart of a program controlling keyboard of the system of FIG. 2.
Figure 3B:
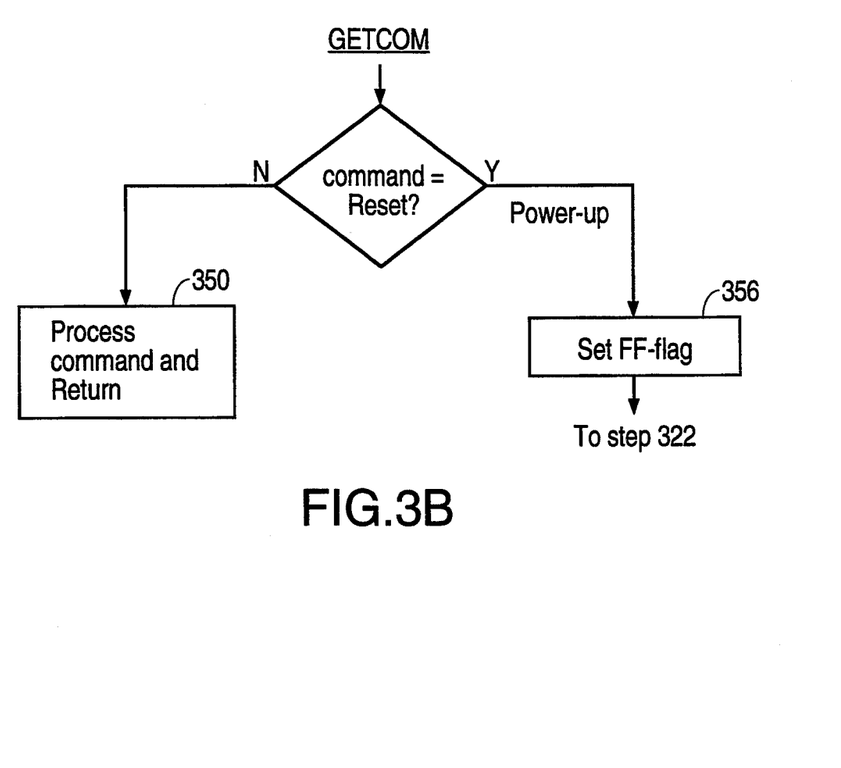

FIGS. 3A and 3B show a flow chart of one embodiment of the program in ROM 260. The program uses, among others, the following variables which are defined in RAM 270 or in a suitable register (not shown) in controller 228:

(1) "FF-flag"—a flag to indicate whether controller 228 has received a Reset command (hexadecimal FF) from host 120;

(2) "NumLock-flag"—a flag to indicate whether the NumLock LED 140.1 is on or off. On power-up, the FF-flag and the NumLock-flag are automatically reset.

On power-up step 316, a POR signal ("power-on reset") us sent to host 120 within a predetermined time period from the power-up. The POR is sent for compatibility with the IBM PC keyboards which sent the POR within the same predetermined time period specified by the IBM. See *IBM Personal System/2 ® Hardware Interface Technical Reference* (First Edition, May 1988) incorporated by reference herein, Chapter "Keyboards (101- and 102-Key)" (hereinafter *IBM-Keyboards*), page 20.

At step 322, the program performs a BAT. This BAT is within the same time limits from power-up as the first BAT in the IBM PCs. See *IBM-Keyboards*, supra, page 20. However, the program does not access LEDs 140. LEDs 140 therefore remain off.

At the completion of the BAT, the program sends to host 120 the same code as sent by the IBM PC keyboards, namely:

(1) a BAT completion code (hexadecimal AA) if the BAT passed;

(2) an error code (hexadecimal FC) if the BAT failed.

At step 330, the program tests the FF-flag. The FF-flag is reset, so control passes to step 340. At step 340, the program waits for a Reset command (hexadecimal FF) from host 120 for up to 2.5 sec. The time limit of 2.5 sec. is chosen because the hosts in many IBM PCs and IBM-compatibles send a Reset to the keyboard within 2.5 sec. after receiving the BAT completion code. Time limits above and below 2.5 sec. are used in some embodiments. The program sets the particular time limit by programming a timer (not shown) in controller 228 or by any other suitable method. Such methods are well known in the art.

Step 340 is organized as a loop. At step 340.1, the program waits for a command (any command) from host 120. If a command is received, control passes to step 340.2 at which the program calls a subroutine GETCOM to process the command.

FIG. 3B shows a flow chart of subroutine GETCOM. If the command is other than Reset, subroutine GETCOM processes the command at step 350 and executes a Return. Control returns to step 340.2, and then loops back to step 340.1.

If the command is Reset, GETCOM passes to step 356. At step 356 the program sets the FF-flag, and control passes back to step 322 (FIG. 3A).

At step 322, a BAT is performed as described above. LEDs 140 are not accessed, and they remain off unless they have been turned on by subroutine GETCOM at step 350. Subroutine GETCOM has turned on one or more LEDs at step 350 if a command to do so was received before the Reset.

At step 330, the program discovers that the FF-flag is set, and control passes to step 360. Another BAT is performed at this step. LEDs 140 are turned on at the beginning of this BAT, and turned off at the end. The BAT completion code or the error code is sent to host 120 as in step 322.

At step 366, LEDs 140 are turned on again. Then, after a suitable delay (300 milliseconds in one embodiment), LEDs 140 are turned off.

Control then passes to steps 372 and 378 (optional) at which the state of NumLock LED 140.1 is restored as described more fully below. Then, at step 382, the programs begins a scanning operation, which consists in scanning the keys, sending appropriate information to host 120, and receiving and processing commands from host 120, as is known in the art. In order to process commands from host 120, the program at step 382 calls subroutine GETCOM in some embodiments.

If a Reset is not received at step 340 for 2.5 seconds (as may be the case with some IBM-compatible hosts), control from step 340 passes to step 382.

As is seen from the above, controller 228 does not access LEDs 140 until it receives a command from host 120. At the same time, keyboard 220 is highly compatible with the IBM PC keyboards. Namely, on power-up, (a) controller 228 performs at least two BATs (three BATs in FIG. 3A: two BATs at step 322 and one BAT at step 360). The first BAT is performed within the same time limits as the first BAT in the IBM PCs;

(b) during one BAT (step 360), LEDs are turned on at the beginning of the BAT and turned off at the end.

(c) the LEDs flash twice (steps 360 and 366). Host 120 issues a Reset not only on power-up, but also in some other situations. All the Reset commands are processed by GETCOM as described above.

Figure 4:
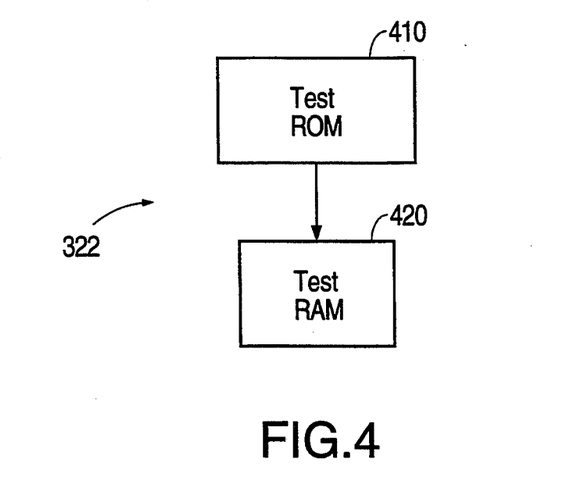
FIG. 4 is a flow chart of one step of the program of FIGS. 3A and 3B.

FIG. 4 shows a flow chart of the BAT at step 322. The BAT at step 360 is similar. At step 410, the ROM checksum is checked as in the IBM PCs. See *IBM-Keyboards*, supra, page 20.

At step 420, the RAM test is performed. The RAM test preserves the contents of RAM 270. Hence data such as the FF-flag, if stored in RAM 270, will not be erased by the test. In some embodiments, the RAM test uses only one register in CPU 250 (in addition to a flag register which holds flags associated with comparisons and other operations). Hence the other registers of CPU 250 are not destroyed by the RAM test. At the same time, the RAM test in some embodiments checks both for the "stuck-at-1" and the "stuck-at-0" conditions of every bit in RAM 270.

Figure 5:
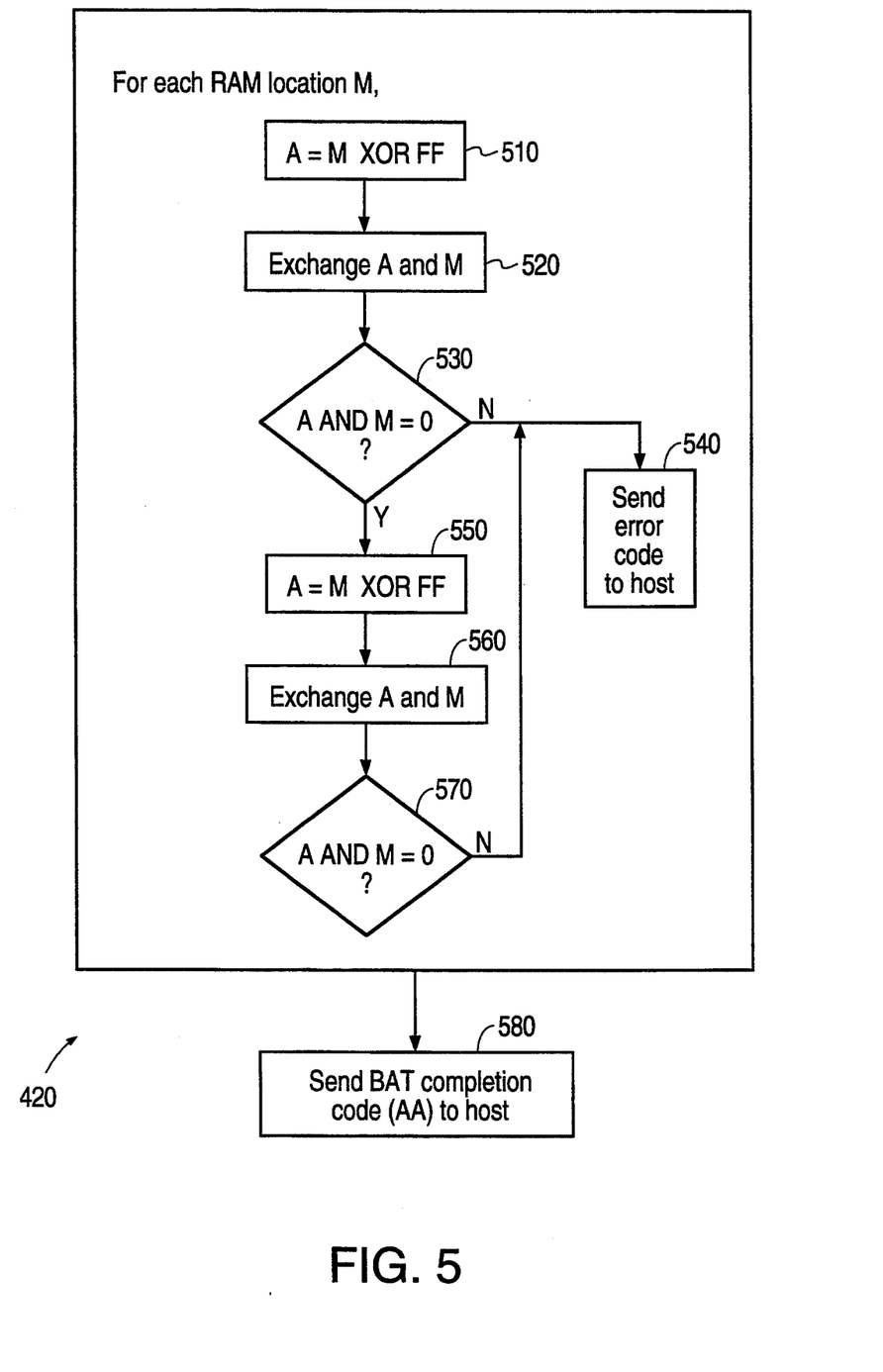
FIG. 5 is a flow chart of one step of FIG. 4.

FIG. 5 shows a block diagram of one embodiment of the RAM test of step 420. In FIG. 5 it is assumed that RAM 270 has 8-bit addressable locations; and that CPU 250 includes an 8-bit accumulator register A. The test of FIG. 5 can easily be adapted to non-8-bit memory locations and to other registers.

Each 8-bit location M in RAM 270 is tested as follows. At step 510, the contents of location M are XORed with hexadecimal FF. (XOR, or Exclusive OR, is a well-known operation of bit-wise addition modulo 2.) The result is placed into accumulator A. Location M remains unchanged. Hence, every bit in accumulator A is the inverse of the bit in the same position in location M. In other words, if a bit in location M is 0, the corresponding bit in accumulator A is 1; if a bit in location M is 1, the corresponding bit in accumulator A is 0.

At step 520, the program exchanges the contents of A and M. Hence A receives the original contents of M, and M receives the inverted contents.

At step 530, A is bitwise ANDed with M. The result must be zero. If it is not, control passes to step 540, at which the error code (hexadecimal FC) is sent to host 120. The RAM test is then terminated.

If A AND M =0, control passes to step 550. M is XORed with FF, and the result is placed into A. Since M holds the inverse of its original contents, A holds the original contents themselves. At step 560, the contents of A and M are exchanged. M holds its original contents, and A holds their inverse. At step 570, A is ANDed with M. If the result is not 0, control passes to step 540. If the result is 0, control loops back to step 510 to test the next memory location or, if all the locations have been tested, to step 580. At step 580, the BAT completion code (hexadecimal AA) is sent to host 120, and the RAM test terminates.

Since at step 570 location M holds it original contents, the RAM test is non-destructive.

In some embodiment, the comparisons at steps 530 and 570 are replaced by the comparison:

A XOR M=FF?

It can be seen that such embodiments test every bit of RAM 270 for both the "stuck-at-1" and the "stuck-at-0" conditions. In some embodiments, steps 530 and 570 are:

A+M=FF?

Other variations are used in other embodiments.

Controller 228 can determine whether LEDs 140 are on or off by reading port 240. However, reading port 240 is unreliable because it involves reading a variable analogue voltage.

In some embodiments, controller 228 determines the state of one or more LEDs without reading port 240. For example, for NumLock LED 140.1, the ROM program defines a flag ("NumLock-flag") in RAM 270 or in a register (not shown) in CPU 250. When host 120 issues a command to turn NumLock LED 140.1 on or off, the program not only executes the command, but also sets or resets the NumLock-flag accordingly. Controller 228 then determines the state of NumLock LED 140.1 by reading the NumLock-flag.

Figure 6:
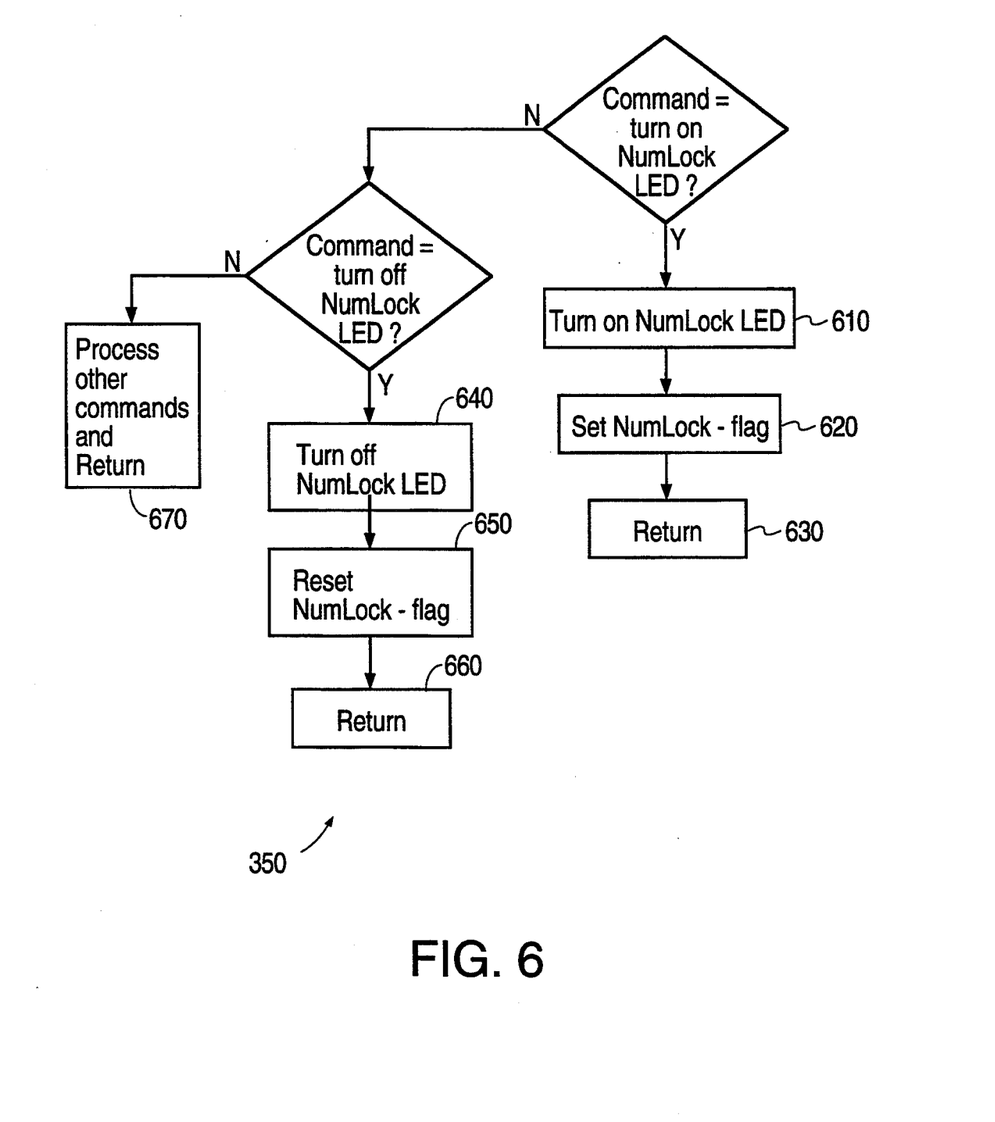
FIG. 6 is a flow chart of one step of the program of FIGS. 3A and 3B.

This technique is illustrated by FIGS. 3A, 3B and 6. On power-up, the NumLock-flag is reset as explained above. Subroutine GETCOM processes the commands to turn the NumLock LED 140.1 on or off at step 350 (FIGS. 3B and 6). If the host command is the command to turn on the NumLock LED, control passes to step 610, at which NumLock LED 140.1 is turned on. Then, at step 620, the NumLock-flag is set. At step 630, the program executes a Return.

If the host command is the command to turn off the NumLock LED, control passes to step 640 at which NumLock LED 140.1 is turned off. At step 650, the NumLock-flag is reset. At step 660, the program executes a Return.

Commands other than to turn the NumLock LED on or off and other than Reset are processed at step 670 by methods known in the art.

In some embodiments, controller 228 determines the state of LEDs 140.2 and 140.3 using similar flags.

The program of FIGS. 3A and 3B preserves the state of NumLock LED 140.1 after a reset. Namely, after LEDs 140 are turned off at step 366, the program tests the NumLock-flag at step 372. If the NumLock-flag is set, NumLock LED 140.1 is turned on at step 378. Otherwise step 378 is skipped.

In some embodiments, the program checks the NumLock-flag at step 366, and turns off NumLock LED 140.1 only if the NumLock-flag is reset. The program does not include steps 372 and 378.

In other embodiments, the program preserves the state of LEDs 140.2 or 140.3 or both using similar techniques.

The microfiche appendix incorporated herein contains the source code listing of one embodiment of the ROM program of FIGS. 3A, 3B and 4–6. The program in the microfiche appendix can be assembled on an IBM PC by the COP800 Cross Assembler available from the National Semiconductor Corporation of Santa Clara, Calif. The program is suitable for the keyboards with microcontroller COP880C described above. The program is entered into the ROM of microcontroller COP880C using methods and equipment described in COP8 *Microcontroller Development Support. Duplicator Board Instruction Manual* (National Semiconductor Corporation, March 1991, NCS Publication Number 420421256-001). This manual is hereby incorporated by reference herein.

The embodiments described above are illustrative and are not intended to limit the invention. In particular, the invention is not limited by the particular types of controller 228 or host 120 or by the number of LEDs 140. The invention could be used with hosts and controllers not yet invented but to be invented in the future. In some embodiments, non-LED devices are used instead of LEDs 140. These devices have visible indicia (such as lights). The devices have two states (called, for example, an "on" state and an "off" state). The controller accesses the devices only after receiving a command from the host.

In some embodiments some or all the functions of the program of FIGS. 3A and 3B are performed by a circuitry not under control of a program. Other embodiments and variations are within the scope of the invention which is defined by the following claims.

What is claimed is:

1. A method for testing a computer input device, said input device including one or more devices each of which has visible indicia for visually indicating whether the respective device is on or off, said method comprising the steps of:

(1) testing said input device by a controller in said input device when said input device is powered up;

(2) issuing a predetermined command by a computer to said input device, and in response to said command:

(3) testing said input device by said controller;

(4) turning on said devices having visible indicia; then (5) turning off said devices having visible indicia; and then (6) turning on said devices having visible indicia, wherein said controller does not access said devices having visible indicia before receiving said command from said computer.

2. The method of claim 1 wherein said step (6) is followed by the steps of:

determining if a selected one of said devices was on when said computer issued said command; and turning off said selected device if said selected device was off when said computer issued said command.

3. The method of claim 1 wherein, after said computer issues said command, said steps (3), (4) and (5) are performed in the order recited, and said method further comprises, between said steps (4) and (5), a step of testing said input device by said controller.

4. The method of claim 1 wherein a waiting time between steps (1) and (2) lasts not more than a predetermined length of time.

5. The method of claim 1 wherein said step (6) is followed a step (7) of turning off said device having visible indicia.

6. The method of claim 5 wherein said step (7) is followed by the steps of:

determining whether a selected one of said devices having visible indicia was on when said computer issued said command; and turning on said selected device if said selected device was on when said computer issued said command.

7. The method of claim 1 wherein said step of issuing a predetermined command by a computer comprises issuing a predetermined command by an IBM PC host computer or an IBM-compatible host computer.

8. The method of claim 7 wherein said step (1) of testing said input device comprises the step of testing a keyboard, and wherein said step (3) of testing said input device comprises the step of testing said keyboard.

9. A method for testing a computer input device including one or more devices each of which has visible indicia for visually indicating whether the respective device is on or off, said method comprising the steps of:

(1) testing said input device by a controller in said input device when said input device is powered up;

(2) issuing a predetermined command by a computer to said input device, and in response to said command:

(3) testing said input device by said controller;

(4) turning on said devices having visible indicia; then (5) turning off said devices having visible indicia; and then (6) turning on said devices having visible indicia, wherein said controller does not access said devices having visible indicia before receiving said command from said computer.

10. In a computer keyboard comprising:

a controller; and a device having visible indicia indicating whether said device is on or off, a method for keeping track of the state of said device by said controller, comprising the steps of:

providing a memory location accessible to said controller;

issuing a command from a computer to said controller to turn on said device, in response, said controller performing the steps of:

turning on said device; and storing a value V1 in said memory location;

issuing a command from said computer to said controller to turn off said device, in response, said controller performing the steps of:

turning off said device; and storing a value V0 different from V1 in said memory location; and reading by said controller said value V0 or V1 in said memory location so as to determine a state of said device from said value in said memory location.

* * * * *

UNITED STATES PATENT AND TRADEMARK OFFICE
CERTIFICATE OF CORRECTION

PATENT NO. : 5,367,472
DATED : November 22, 1994
INVENTOR(S) : Abbas Khashayar

It is certified that error appears in the above-indentified patent and that said Letters Patent is hereby corrected as shown below:

On cover page, item [73], change Assignee from "Alps Electric Co., Ltd., Tokyo, Japan" to --Alps Electric (U.S.A.), Inc., San Jose, California--

Signed and Sealed this

Sixteenth Day of May, 1995

Attest:

BRUCE LEHMAN

Attesting Officer   Commissioner of Patents and Trademarks